United States Patent
Fautz et al.

(10) Patent No.: US 7,511,489 B2
(45) Date of Patent: Mar. 31, 2009

(54) MRT IMAGING ON THE BASIS OF CONVENTIONAL PPA RECONSTRUCTION METHODS

(75) Inventors: Hans-Peter Fautz, Freiburg (DE); Stephan Kannengiesser, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 161 days.

(21) Appl. No.: 11/409,353

(22) Filed: Apr. 21, 2006

(65) Prior Publication Data

US 2006/0261810 A1 Nov. 23, 2006

(30) Foreign Application Priority Data

Apr. 22, 2005 (DE) .................. 10 2005 018 939

(51) Int. Cl.
*G01V 3/00* (2006.01)
(52) U.S. Cl. ........................ 324/307; 324/309
(58) Field of Classification Search ......... 324/306–322, 324/300–305; 600/407–425; 382/128–131
See application file for complete search history.

(56) References Cited

U.S. PATENT DOCUMENTS

| 6,801,034 | B2 | 10/2004 | Brittain et al. ............... 324/309 |
| 6,998,841 | B1* | 2/2006 | Tamez-Pena et al. ......... 324/302 |
| 2003/0004408 | A1* | 1/2003 | Zhu ............................ 600/410 |
| 2004/0193038 | A1* | 9/2004 | Reykowski et al. .......... 600/410 |
| 2004/0222794 | A1 | 11/2004 | Griswold et al. ............. 324/309 |
| 2004/0263168 | A1 | 12/2004 | Hennig et al. ................ 324/309 |
| 2005/0184730 | A1* | 8/2005 | Tamez-Pena et al. ......... 324/302 |
| 2006/0145696 | A1* | 7/2006 | Fuderer et al. ............... 324/309 |
| 2006/0261810 | A1* | 11/2006 | Fautz et al. .................. 324/309 |
| 2006/0261818 | A1* | 11/2006 | Zank et al. ................... 324/457 |
| 2007/0252597 | A1* | 11/2007 | Posse .......................... 324/312 |

OTHER PUBLICATIONS

"Parallel Imaging for Continuously Moving Table MRI Using RF Coils and In-Place Sensitivity Calibration," Kannengiesser, Workshop, ETH Zürich 2004.
"Continuously Moving Table Data Acquisition Method for Long FOV Contrast-Enhanced MRA and Whole-Body MRI," Kruger et al, Magnetic Resonance In Medicine, vol. 47 (2002) pp. 224-231.

* cited by examiner

*Primary Examiner*—Diego Gutierrez
*Assistant Examiner*—Tiffany A Fetzner
(74) *Attorney, Agent, or Firm*—Schiff Hardin LLP

(57) ABSTRACT

In a method for magnetic resonance imaging on the basis of a partially-parallel acquisition (PPA) reconstruction method and a magnetic resonance tomography apparatus, data for at least two two-dimensional slices of a patient are acquired (which two-dimensional slices are displaced in the direction of a slice-selection gradient (z-gradients) defining the slice-normal direction) with at least one data acquisition in k-space (which acquisition forms a partial data set) per slice with a number of component coils, with the sum of all partial data sets forming a complete data set in k-space. The coil sensitivities of each component coil are determined on the basis of the complete data set. At least one partial data set of each slice is completed with a PPA reconstruction method on the basis of the determined coil sensitivities. The completed slices in k-space are transformed into whole images in the spatial domain.

16 Claims, 6 Drawing Sheets

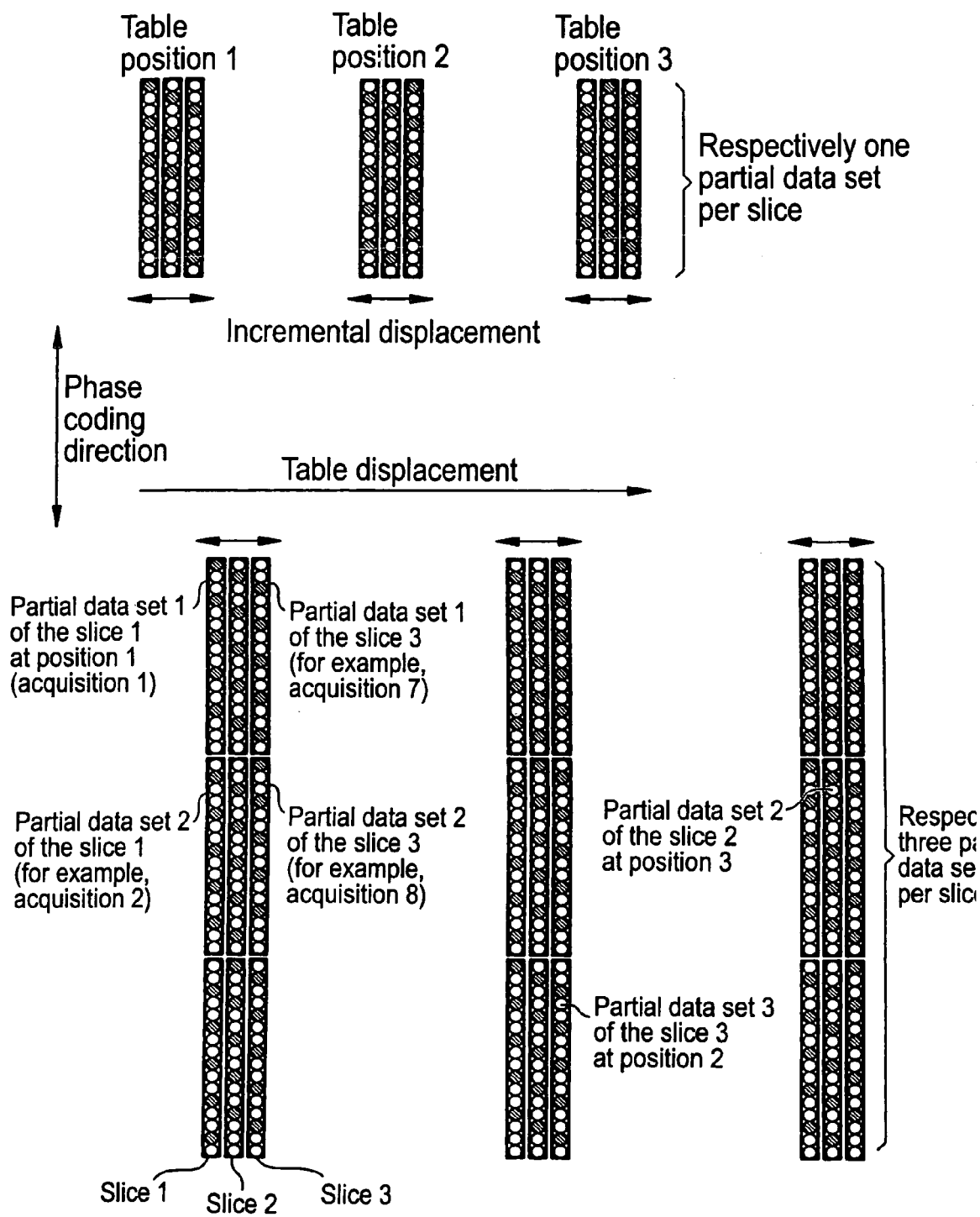

MRT IMAGING ON THE BASIS OF CONVENTIONAL PPA RECONSTRUCTION METHODS

BACKGROUND OF THE INVENTION

1. Field of the Invention

The present invention generally concerns magnetic resonance tomography (MRT) as employed in medicine for examination of patients. The present invention concerns a method as well as an MRT system for implementation of the method that enable the acquisition of reduced-artifact or improved-resolution slice images that are displaced relative to one another in the z-gradient direction.

2. Description of the Prior Art

MRT is based on the physical phenomenon of nuclear magnetic resonance and has been successfully used as an imaging method for over 15 years in medicine and biophysics. In this examination modality, the subject is exposed to a strong, constant magnetic field. The nuclear spins of the atoms in the subject, which were previously randomly oriented, thereby align.

Radio-frequency energy can now excite these "ordered" nuclear spins to a specific oscillation. In MRT, this oscillation generates the actual measurement signal which is acquired by suitable reception coils. By the use of inhomogeneous magnetic fields generated by gradient coils, the measurement subject can be spatially coded in all three spatial directions. The method allows a free selection of the slice to be imaged, so that slice images of the human body can be acquired in all directions. MRT as a slice image method in medical diagnostics that is distinguished predominantly as a "non-invasive" examination method with a versatile contrast possibility. Due to the excellent ability to represent the soft tissue, MRT has developed into a method superior in many ways to x-ray computed tomography (CT). MRT today is based on the application of spin echo and gradient echo sequences that enable an excellent image quality with measurement times in the range of seconds to minutes.

For examination of larger segments of a patient, or for whole-body exposures, a continuous table displacement (move during scan, MDS) is used. In particular, the use of measurement device in connection with segmented imaging sequences such as, for example, a multi-shot TSE sequence (turbo spin echo, TSE) appears promising given whole-body examinations of metastases (whole-body metastasis screening). Despite the technical advances in the design of MRT apparatuses, resolution, acquisition time and signal-to-noise ratio (SNR) of an MRT image remain limiting factors with regard to the image quality, which presently (in particular in MDS-based imaging) inevitably lead to image artifacts as well as to residual apparatus-dependent artifacts.

One possibility to reduce movement artifacts known in the prior art is the application of accelerated MRT imaging methods, of which PPA (partial parallel acquisition) methods are examples. PPA is explained in the following:

As shown in FIG. 2, the acquisition of data in MRT occurs in k-space (frequency domain). The MRT image 25 in the image domain is linked with the MRT data 23 in k-space by means of Fourier transformation 24. The spatial coding of the subject which spans k-space occurs by means of gradients in all three spatial directions. In the case of 2D imaging, differentiation is thereby made between slice selection (establishes an acquisition slice in the subject, typically the z-axis), frequency coding (establishes a direction in the slice, typically the x-axis) and phase coding (determines the second dimension within the slice, typically the y-axis). In the case of 3D imaging, the slice selection is replaced by a second phase coding direction. Without limitation as to generality herein, two-dimensional Cartesian k-space is assumed, which is sampled line-by-line. The data of a single k-space line are frequency-coded by means of a gradient upon readout. Each line in k-space has the interval $\Delta k_y$ that is generated by a phase coding step. Since the phase coding takes a great deal of time in comparison with the other spatial codings, many methods, including PPA, are based on a reduction of the number of time-consuming phase coding steps to shorten the image measurement time. The fundamental idea of PPA imaging is that the k-space data are not acquired by a single coil, but rather (according to FIG. 3A) by a (for example linear) arrangement of component coils (coil 1 through coil 4), a coil array. Each of the spatially-independent coils of the array carries certain spatial information which is used in order to achieve a complete spatial coding via a combination of the simultaneously-acquired coil data 26.1, 26.2, 26.3, 26.4. This means that a number of other unsampled lines 32 (shown dotted in white in the following figures) that are ordered in k-space can also be determined from a single acquired k-space line (shown in grey in the following figures).

PPA methods thus use spatial information that is contained in the components of a coil arrangement in order to partially replace the time-consuming phase coding that is normally generated using a phase gradient. The image measurement time is thereby reduced corresponding to the ratio of number of the lines of the reduced data set to the number of the lines of the conventional (thus completed) data set. In comparison to the conventional acquisition, in a typical PPA acquisition only a fraction (½, ⅓, ¼, etc.) of the phase coding lines are acquired. A special reconstruction is then applied to the data in order to reconstruct the missing k-space lines and thus to obtain the full field of view (FOV) image in a fraction of the time (FOV is the image region of interest to be acquired).

Different PPA methods use different reconstruction methods (which normally are algebraic methods). The best known PPA techniques are SMASH (simultaneous acquisition of spatial harmonics), SENSE (sensitivity encoding) and GRAPPA (generalized auto-calibration PPA).

In all PPA techniques the algebraic reconstruction of the missing k-space lines additionally requires identification of the respective component coil of each component coil participating in the measurement, which in FIG. 3 is symbolized by the arrow 28. A complete reconstruction of all k-space lines is possible only given knowledge of the coil sensitivities, and the image 25 in the spatial domain is obtained by subsequent Fourier transformation (arrow 27).

In the conventional PPA techniques, the determination of the coil sensitivities ensues by measurement of calibration scans, whether at the beginning of the measurement in the form of pre-scans or during the measurement in the form of integrated scans (ACS lines, autocalibration signals), that are represented in FIG. 4 as black k-space lines in the middle region of the k-matrix (k-space slice).

Although the coil sensitivities can be approximated well by only a few calibration scan lines from the middle region of the k-matrix (which predominantly contains contrast information), the measurement of calibration scan lines nevertheless significantly extends the total acquisition time and increases the degree of movement artifacts in the reconstructed image 25.

In the prior art it is possible to measure a slice to be acquired in the form of partial data sets of k-space which in their entirety again form a complete k-space data set, on the basis of which (averaged and/or filtered) the respective coil sensitivity of each component coil can then be determined by calculation. This PPA method has the object to even further reduce the total measurement time, by the measurement of calibration scan lines being omitted. The method is described in S. Kannengiesser et al., Proc. ISMRM 12, 2149 (2004). As described therein, a measurement of the same slice in the spatial domain ensues according to FIG. 6 by the measurement of a number (here two) of partial data sets of k-space 30, 31. In the first partial data set 30, only each odd line of the selected k-space slice (line 1, line 3, line 5 etc.) was acquired and only each even line (line 2, line 4, line 6 etc.) was acquired in the second partial data set 31. Taken together, the first partial data set 30 and the second partial data set 31 form a complete data set 32 of k-space. By the separation of the measurement into non-overlapping partial data sets, each partial data set separately represents a PPA data set that can be respectively reconstructed into a complete k-space data set by means of known PPA reconstruction methods (SMASH, SENSE, GRAPPA). The chronological order of the sampling of data set 32 is advantageously selected such that each partial data set 30, 31 separately contains the least possible movement artifacts so that, after the respective PPA reconstruction both reconstructed data sets are combined into an image, the final image ultimately contains minimal movement artifacts without forfeiting SNR. The division into non-overlapping partial data sets enables a calculation of the coil sensitivities necessary for the PPA reconstruction without having to acquire separate calibration scan lines therefor, which ultimately leads to a significantly shorter acquisition time.

Nonetheless, in such accelerated PPA-based MRT imaging methods resolution and movement- and apparatus-conditional inconsistencies, particularly given the acquisition of a number of slices displaced relative to one another in the z-direction (for example by continuous table displacement during the measurement), represent limiting factors that manifest themselves in residual artifacts in the spatially-resolved image.

SUMMARY OF THE INVENTION

An object of the present invention is to provide a method as well as a system for implementation of the method which enables the PPA imaging of slice images to be improved with regard to artifact reduction or increasing the resolution without SNR loss (signal-to-noise ratio).

This object is achieved according to the invention by a method for MRT based on a PPA reconstruction method, including the following steps:

measurement of at least two two-dimensional slices of a patient to be examined (which two-dimensional slices are displaced in the direction of a slice-selection gradient (z-gradients) defining the slice-normal direction) via at least one acquisition in k-space (which acquisition forms a partial data set) per slice with a number of component coils, with the sum of all partial data sets forming a complete data set in k-space, determination of the coil sensitivities of each-component coil on the basis of the complete data set, completion of at least one partial data set of each slice by a PPA reconstruction method on the basis of the determined coil sensitivities, and transformation of the completed slices in k-space into whole images in the spatial domain.

In one embodiment of the invention, the displacement of the slices is effected by a patient table displacement and corresponding displacement of the RF excitation, so that the slices essentially represent the same anatomical slice.

In a further embodiment of the invention, the displacement of the slices in the z-direction is effected by an incremental displacement of the z-gradient and/or by a patient table displacement, such that the slices lie close to one another or overlap.

In the event that the slices lying close to one another or overlapping represent a slice block, these can be entrained in blocks or segments corresponding to a patient table displacement.

The determination of the coil sensitivities can be based on a weighted averaging of the partial data sets.

Furthermore, the determination of the coil sensitivities can be based on a filtering of the partial data sets.

In a further step of the inventive method, information about patient movement and/or apparatus imperfections is acquired from a number of whole images of the same or adjacent slices.

The whole images are corrected before a further use on the basis of the information so acquired or from other sources about patient movement and/or apparatus imperfections.

The inventive method enables an improvement of the imaging by the transformed images of the essentially identical anatomical slice being suitably recombined to reduce residual artifacts and/or to improve the SNR, while the transformed images of incrementally-displaced or overlapping slices being suitably filtered to reduce residual artifacts and/or to improve the SNR.

The acquisition, in particular of a partial data set, can ensue with an echo train of a turbo spin echo sequence (TSE sequence).

The above object also is achieved in accordance with the present invention by a magnetic resonance imaging apparatus that implements the inventive method described above.

The above object also is achieved in accordance with the present invention by a computer software product in the form of a storage medium encoded with computer-readable data that, when loaded into a control computer or an imaging computer of a magnetic resonance apparatus, implements the above-described inventive method.

DESCRIPTION OF THE DRAWINGS

FIG. 9 shows a combination of the data acquisitions from FIGS. 7 and 8 in the upper part, and the general case of a data acquisition (divided into partial data sets) of displaced 2D slices in the lower part.

DESCRIPTION OF THE PREFERRED EMBODIMENTS

Figure 1:
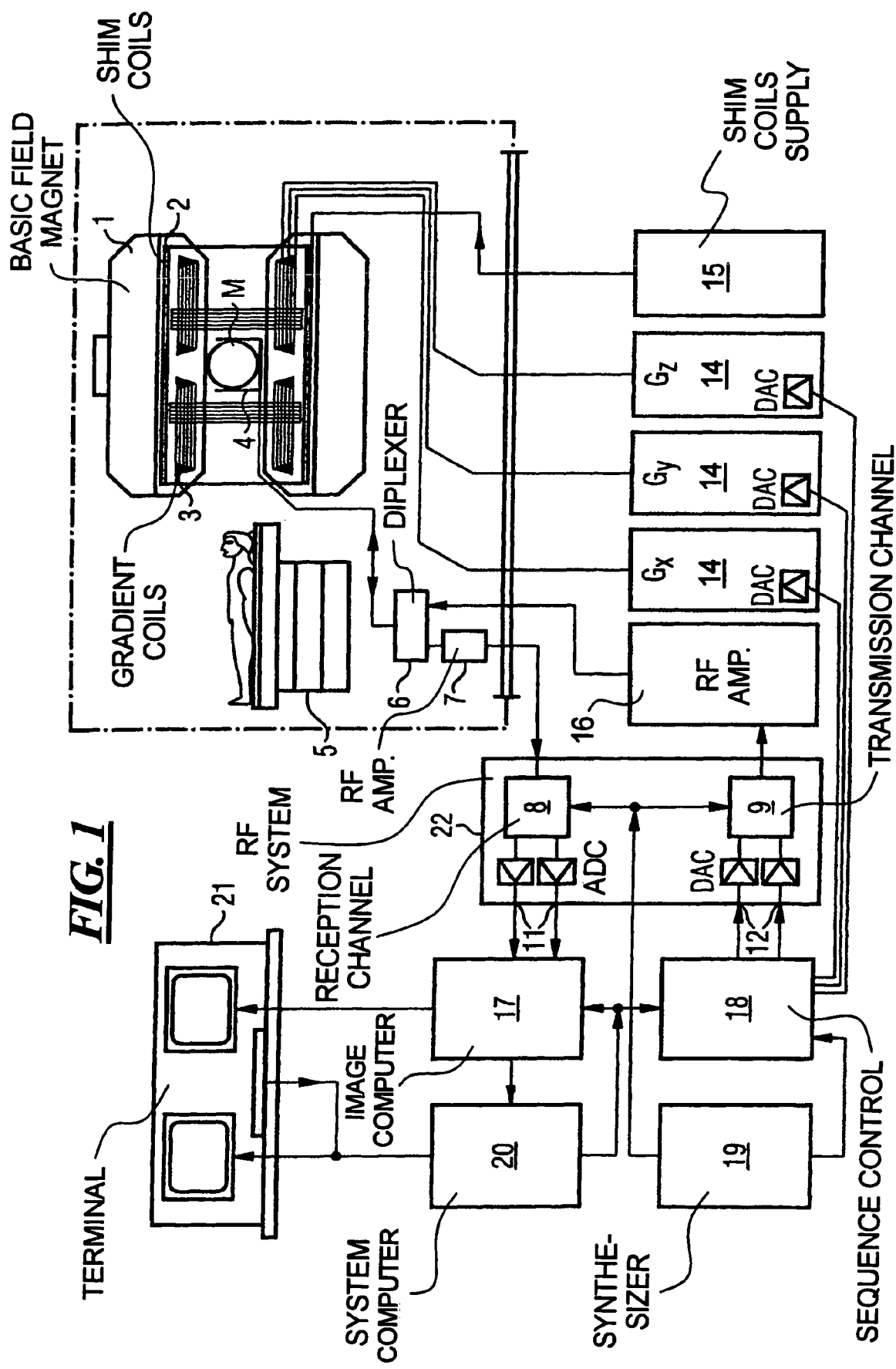
FIG. 1 is a schematic block diagram of an inventive MRT apparatus for implementation of the inventive method.
Figure 2:
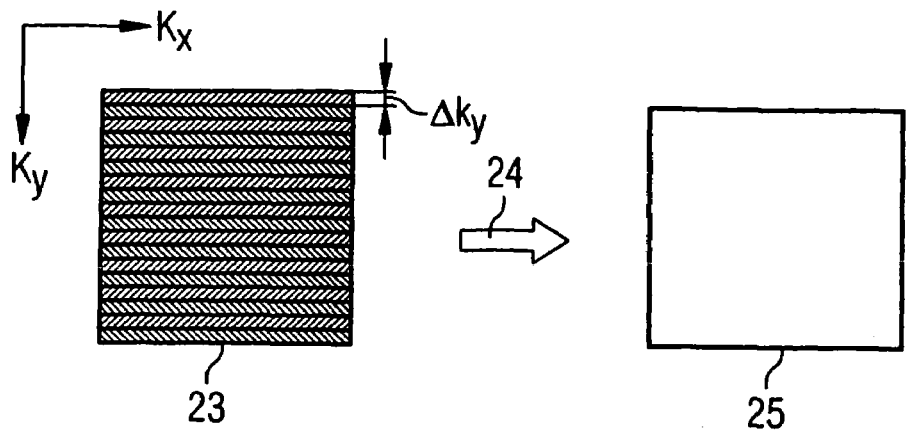
FIG. 2 schematically shows the conventional procedure of how an image in the spatial domain is obtained via Fourier transformation of an image acquired in k-space.
Figure 3:
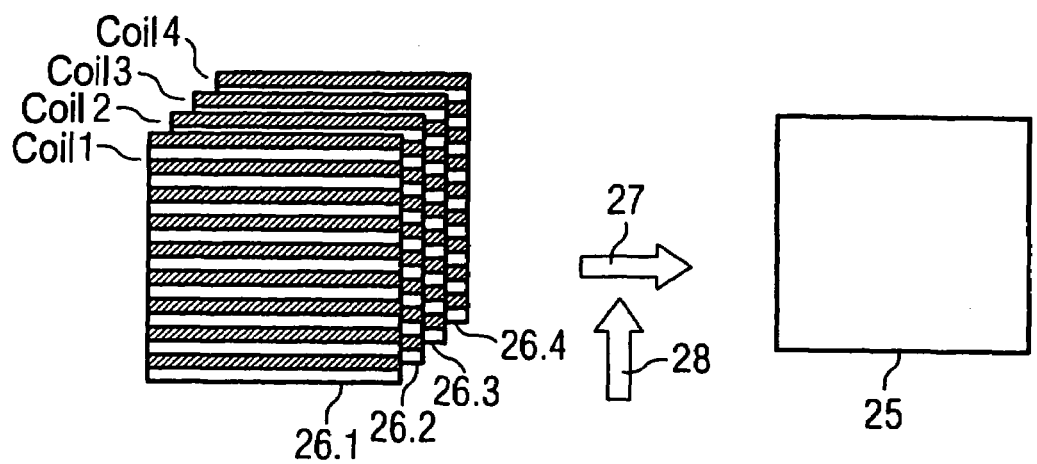
FIG. 3 schematically shows how a four-component PPA data set is reconstructed dependent on the coil sensitivities, and is converted into an image in the spatial domain by Fourier transformation.
Figure 4:
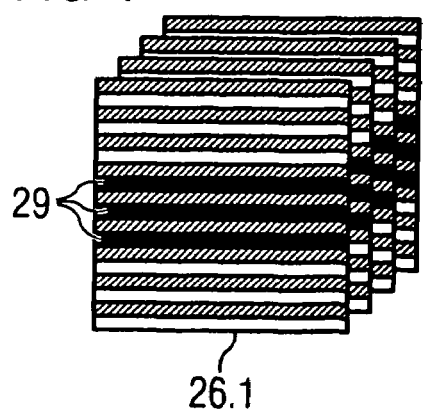
FIG. 4 schematically shows a four-component data set With three additionally-acquired calibration scan lines required for PPA reconstruction.
Figure 5:
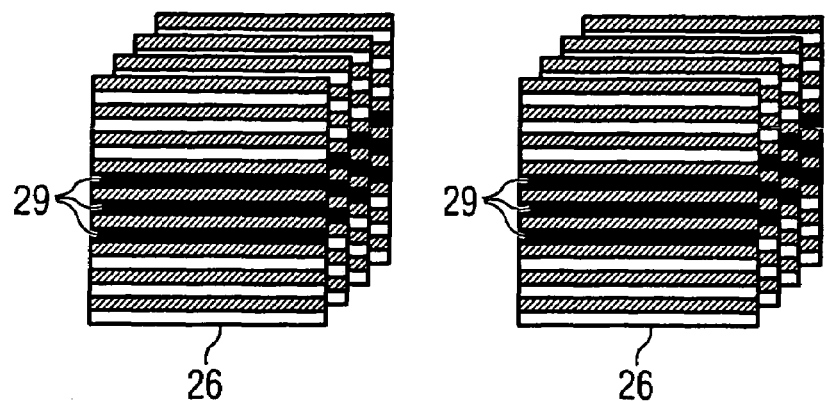
FIG. 5 schematically shows a method for PPA-based movement artifact-reduce image acquisition without SNR loss according to the prior art.
Figure 6:
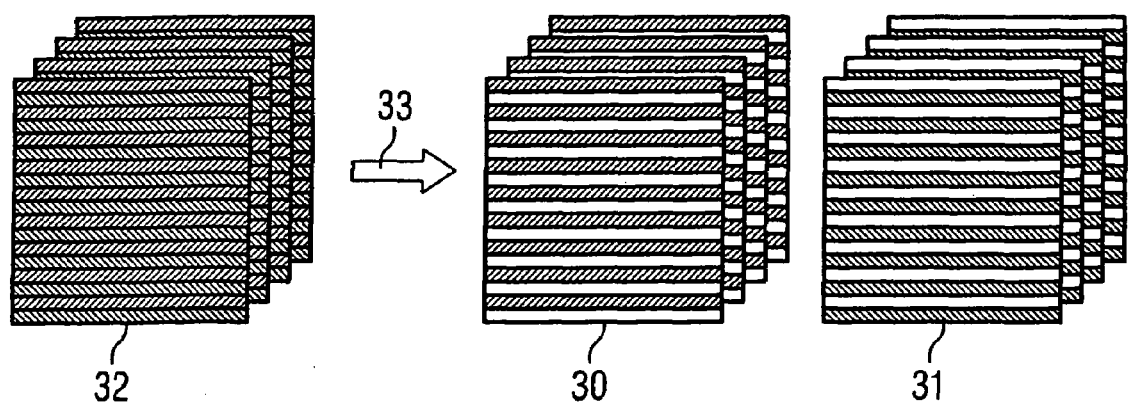
FIG. 6 shows (using an overview image) a prior art method for PPA imaging without explicit measurement of calibration lines.

FIG. 1 is a schematic illustration of a magnetic resonance imaging or magnetic resonance tomography apparatus for generating a magnetic resonance image of a subject according to the present invention. The design of the magnetic resonance tomography apparatus thereby corresponds that of a conventional magnetic tomography apparatus, with the differences identified below. A basic field magnet 1 generates a temporally-constant strong magnetic field for polarization or alignment of the nuclear spins in the examination region of a subject such as, for example, of a part of a human body to be examined. The high homogeneity of the basic magnetic field necessary for the magnetic resonance measurement is defined in a spherical measurement volume V in which the parts of the human body to be examined are introduced. To support the homogeneity requirements, and in particular for elimination of temporally invariable influences, shim plates made of ferromagnetic material are mounted at a suitable location. Temporally variable influences are eliminated by shim coils 2 that are activated by a shim power supply 15.

A gradient coil system 3 is composed of a number of windings (sub-windings) is disposed in the basic field magnet 1. Each sub-winding is supplied with current by an amplifier for generation of a linear gradient field in the respective directions of the Cartesian coordinate system. The first sub-coil of the gradient coil system 3 thereby generates a gradient Gx in the x-direction, the second sub-coil generates a gradient Gy in the y-direction and the third sub-coil generates a gradient Gz in the z-direction. Each amplifier includes a digital-analog converter that is activated by a sequence controller 18 for time-accurate generation of gradient pulses.

Located within the gradient coil system 3 is a radio-frequency antenna 4 that converts the radio-frequency pulses emitted by a radio-frequency power amplifier into an alternating magnetic field for excitation of the nuclei and alignment of the nuclear spins of the subject to be examined or of the region of the subject to be examined. The radio-frequency antenna 4 includes one or more RF transmission coils and a number of RF reception coils in the form, for example, of a linear array of component coils in PPA imaging systems. The alternating field originating from the precessing nuclear spins (i.e. normally the nuclear spin echo signals caused by a pulse sequence composed of one or more radio-frequency pulses and one or more gradient pulses) is also converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which are generated the radio-frequency pulses for excitation of the magnetic resonance. The respective radio-frequency pulses are thereby digitally represented in the sequence controller 18 as a series of complex numbers based on a pulse sequence predetermined by the system computer 20. The real and imaginary parts of this number series are respectively supplied via inputs 12 to a digital-analog converter in the radio-frequency system 22, and from this to a transmission channel 9. In the transmission channel 9, the pulse sequences are modulated with a radio-frequency carrier signal having a base frequency that corresponds to the resonance frequency of the nuclear spins in the measurement volume.

The switch-over from transmission to reception operation ensues via a transmission-reception diplexer 6. The RF transmission coil of the radio-frequency antenna 4 radiates the radio-frequency pulses for excitation of the nuclear spins into the measurement volume V for excitation of the nuclear spins and samples resulting echo signals via the RF reception coils. The correspondingly-acquired magnetic resonance signals are phase-sensitively demodulated in the reception channel 8 of the radio-frequency system 22 and translated into a real part and an imaginary part of the measurement signal via respective analog-digital converters. An image is reconstructed by an image computer 17 from the measurement data acquired in this manner. The administration of the measurement data, the image data and the control programs ensues via the system computer 20. Based on requirements set by control programs, the sequence controller 18 monitors the generation of the respective desired pulse sequences and the corresponding sampling of k-space. The sequence controller 18 in particular controls the time-accurate switching of the gradients, the emission of the radio-frequency pulses with defined phase and amplitude and the reception of the magnetic resonance signals. The time base for the radio-frequency system 22 and the sequence controller 18 is provided by a synthesizer 19. The selection of suitable control programs for generation of a magnetic resonance image as well as the representation of the generated magnetic resonance image ensues through a terminal (console) 21 that has a keyboard as well as one or more display screens.

A goal of the present invention is to improve the PPA imaging of identical slice images or slices images displaced against one another in the slice selection gradient direction (designated in the following as the z-direction) with regard to artifact reduction or increase of the resolution without SNR loss (signal-to-noise ratio). The displacement of the slices ensues by (continuous) table displacement and/or via incremental displacement of the RF excitation. The inventive method uses primary segmented imaging sequences such as, for example, interleaved multi-shot turbo spin echo sequences (interleaved multi-shot TSE), with an echo train supplying a partial data set (acquisition duration in the range of approximately 200 ms).

In the case of the present invention, using a number of component coils or a coil array in the phase coding direction, it is possible for the user to predetermine the order of the (in the case of a Cartesian sampling) line-by-line sampling in the phase coding direction such that the measurement is divided into partial data sets. The division into partial data sets ensues such that, although each partial data set is separately incomplete, the sum of all partial data sets or the sum of a subset of partial data sets (thus the superimposition of all or specific partial data sets), results in a complete data set again. In a further step, the complete data set then allows—without time-consuming acquisition of calibration scan lines—the determination of the coil sensitivities of the participating component coils on the basis of which each partial data set can be separately re-completed using a known algebraic PPA reconstruction method (for example GRAPPA). The partial data sets to be completed, or the partial data sets completed after the PPA reconstruction, can cover or represent different regions in the spatial domain, which is explained in the following using FIGS. 7, 8 and 9.

Figure 7:
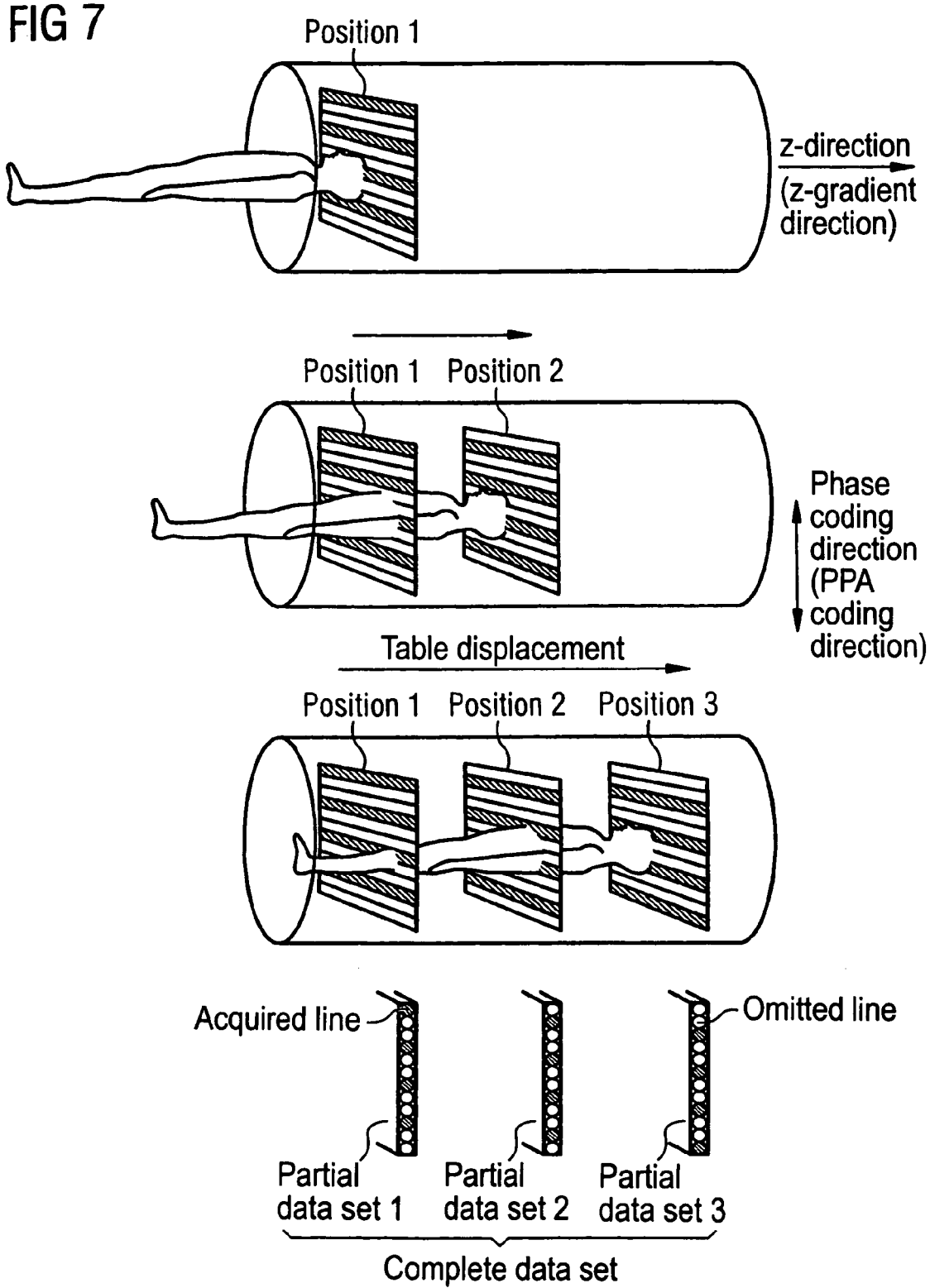
FIG. 7 shows the acquisition of slices of essentially the entire anatomy, which slices form a complete data set and are displaced by table displacement.
Figure 8:
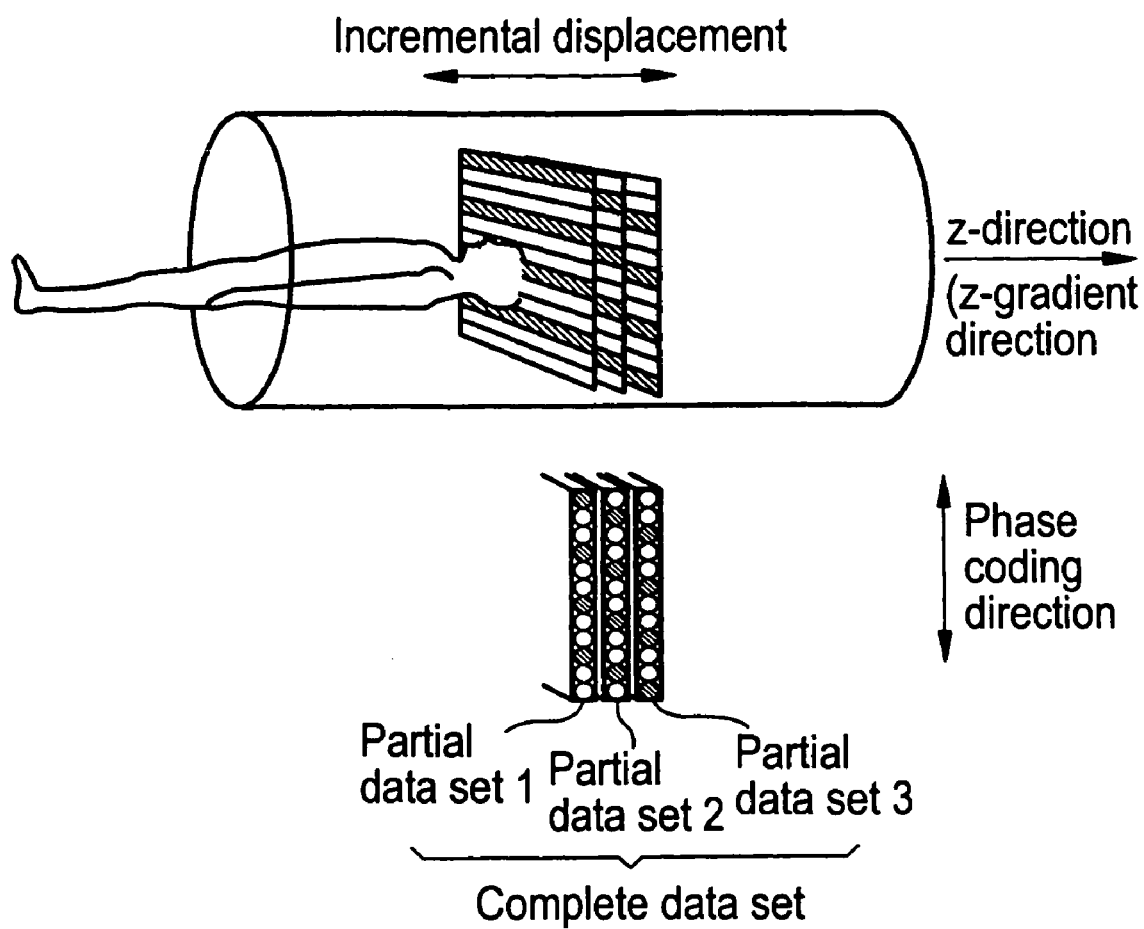
FIG. 8 shows the acquisition of incrementally-displaced slices forming a complete data set.

1. Each partial data set represents essentially the same anatomical slice of the patient, but at different points in time and at different locations when the patient assumes different positions in the scanner by a (continuous) table displacement in the z-gradient direction. In FIG. 7 this is shown in the example of a head acquisition: the patient is inserted (by means of a table displacement) into the gradient tube up to position 1; at this position 1, a first partial data set (partial data set 1) is acquired in that—starting with the first line—only each third k-space line is measured in the phase coding direction (the measured lines are grey, the omitted lines are shown in white). The patient is subsequently displaced further to position 2 with the acquisition of a second partial data set (partial data set 2) as well as (after further displacement) to position 3 with the acquisition of a third partial data set (partial data set 3) that is measured in essentially the same anatomical slice as that at position 1. The partial data sets respectively differ due to different k-space sampling: while the measurement in partial data set 1 is begun with the first k-space line, the measurement in partial data set 2 begins with the second line and the measurement in partial data set 3 begins with the third line. A common feature of all partial data sets is that two lines are always omitted, which overall yields a PPA-acceleration factor of 3. As is clearly seen from FIG. 7, the three partial data sets in total form a complete data set in k-space that allows (for example considering only the middle k-space lines) the coil sensitivities of the component coils participating in the measurement to be determined without calibration lines having to be separately measured for these. The superimposition of the non-overlapping partial data sets that leads to the complete data set can be combined with a filtering, via which different patient- and apparatus-specific framework conditions of the different positions can be compensated that would normally lead to strong (ghost) artifacts in the reconstructed image. For example, the anatomy of the slice to be acquired can thus change during the table displacement (patient-specific brain pulsation, breathing, peristalsis etc.), such that other anatomical relationships can predominate in the different acquisition positions. Alternatively, apparatus-specific inconsistencies are present in the different positions, for example in that basic field inhomogeneities or gradient field distortions vary in the z-gradient direction. A special form of filtering is a combination of more partial data sets than are necessary at minimum for a complete data set. The inventive division of these position-dependent changes of the framework conditions into different incomplete partial data sets and their subsequent reconstruction on the basis of reconstruction parameters (coil sensitivities) allowing for this division enables the suppression of movement artifacts and residual, apparatus-conditional artifacts in the later image. Furthermore, the information about various states of the same anatomical slice under the influence of, for example, breathing or variable table position can be used for characterization of these influences.

2. The partial data sets represent slices incrementally displaced in the z-gradient direction, thus immediately adjacent or even overlapping slices of the patient to be examined. This is again shown in FIG. 8 in the example of a head exposure: the patient is inserted (by means of a table displacement) into the scanner, whereby either three partial data sets are measured in immediate temporal succession during the displacement (the table feed as well as the sample rate thereby define the degree of the displacement or of the overlapping) or the measurement of three incrementally-displaced partial data sets ensues in the same position (without table movement), with the incremental displacement being effected by corresponding incremental variation of the RF excitation. A combination of both displacement mechanisms and a variation of the acquisition of the partial data sets are also possible. The partial data sets are in turn measured with PPA coding, such that their combination forms a complete data set from which the coil sensitivities are derived and on the basis of which the partial data sets are algebraically reconstructed (for example with the GRAPPA reconstruction method) and transformed into the spatial domain. An individual usage of the transformed images given incremental displacement enables an increase of the resolution in the z-gradient direction by a factor that corresponds to the number of the partial data sets. A compromise between resolution in the z-gradient direction and artifact suppression or, respectively, SNR gain is achievable by suitable filtering in the z-gradient direction.

3. The partial data sets represent both identical [equal] anatomical slices of the patient. (with or without continuous table displacement) and slices incrementally displaced relative to these equal anatomical slices, which overall amounts to a combination of the situations of FIGS. 7 and 8 and is shown in the upper part of FIG. 9. The combination of the partial data sets can in this case ensue in two manners: either via the incremental displacement (slice 1, slice 2, slice 3) or by the different positioning (position 1, position 2, position 3).

4. The situation in the lower part of FIG. 9 represents a more general case in which the division into partial data sets likewise extends over an individual slice. As before, a division of the partial data sets into three incrementally-displaced slices (slice 1, slice 2 and slice 3) given a defined table position (position 1, position 2, position 3) exists in the lower slice of FIG. 9, whereby additionally each individual slice in turn experiences a division into three partial data sets arranged vertical relative to one another. Depending on how a PPA coding should ensue, the temporal sequence of the acquisition of the partial data sets is effected. One possible order of the k-space sampling in the lower part of FIG. 9 would, for example, be the acquisition of the three partial data sets of the slice 1 at position 1, whereby first the upper, then the middle and finally the lower partial data set is measured. The partial data sets of slice 2 (always still at position 1) and of slice 3 are acquired in the same order. This repeats for the three slices at the positions 2 and 3. Since all partial data sets exhibit the same number of k-space lines, in the framework of a PPA reconstruction it is possible to form different combinations of partial data sets until these together form a complete data set. The combination can extend over a single slice, over an incremental displacement or even over the slices at different table positions. Naturally, all partial data sets do not have to be identically dimensioned. In the case of a different line count or different PPA coding (different number of unmeasured k-space lines), the combination possibilities are then limited.

It should be noted that the possibility exists to effect a correction of the PPA-completed images before the further usage via established methods, for example the correction of geometric gradient distortions dependent on the position in the apparatus at which the corresponding partial data set was measured. A correction of the PPA-completed image on the basis of the information (acquired from its entirety) about patient movement and/or apparatus imperfections is likewise possible.

In summary, in accordance with the invention, the acquisition of at least two 2D slices displaced in the z-gradient direction is separated by a modified imaging sequence into artifact-reduced partial data sets that are respectively reconstructed again into whole images in a PPA manner. The detector or, respectively, coil sensitivity information that is necessary for a PPA reconstruction is obtained by a suitable combination of the raw data of a number of partial data sets (advantageously of the middle region of the k-space data set). It is a requirement for this that an acquisition of the individual partial data sets inventively ensues such that the sum of the merged partial data sets again form a complete data set. Each completed image (also designated as a "whole image") separately exhibits a reduced signal-to-noise ratio, which can be regained by recombination into a total whole image. Depending on this, an occurrence of image artifacts and residual apparatus artifacts can be avoided via merging of whole images of the essentially identical anatomical slice given different positions. Furthermore, given individual consideration of the whole images information can be acquired about the movement and the apparatus properties. Before the further usage, each image can then be corrected on the basis of this information or on the basis of previously-known information, for example time-invariant geometric gradient distortions. If the resolution in the z-gradient direction of slices adjacent in the z-gradient direction should be increased, a compromise between resolution and artifact suppression or SNR gain can thus be accepted by suitable filtering in the z-direction, for example by low-pass filtering.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic resonance imaging comprising the steps of:
    exciting nuclear spins in an examination subject by irradiating the examination subject with radio-frequency energy from multiple coils among a plurality of component coils, each of said coils having a coil geometry that defines a coil sensitivity for that coil;
    with said multiple coils for each of at least two two-dimensional slices of the examination subject, acquiring magnetic resonance signals resulting from said irradiation with said RF energy, and entering the received magnetic resonance signals as data in k-space, the data in k-space for each of said slices forming a partial data set with a sum of the respective partial data sets of said at least two two-dimensional slices forming a complete data set in k-space, said at least two two-dimensional slices being displaced in a direction of a slice-selection gradient defining a direction normal to said at least two two-dimensional slices;
    automatically electronically calculating the individual coil sensitivities of the respective multiple component coils exclusively from said complete data set;
    completing at least one partial data set of each of said at least two two-dimensional slices using a PPA reconstruction technique and the calculated individual coil sensitivities, thereby obtaining a plurality of completed slices in k-space; and
    mathematically transforming the plurality of completed slices in k-space into respective whole images in the image domain.

2. A method as claimed in claim 1 comprising displacing said at least two two-dimensional slices by displacing a table on which the subject is disposed and displacing the excitation with said RF energy, to cause said at least two two-dimensional slices to represent a same anatomical slice.

3. A method as claimed in claim 2 comprising combining the respective images in said image domain to obtain a combined image having at least one of reduced residual artifacts and improved SNR.

4. A method as claimed in claim 1 comprising displacing said at least two two-dimensional slices by incrementally displacing said slice selection gradient in said direction normal to said slices, to cause said at least two two-dimensional slices to have a relationship relative to each other selected from the group consisting of adjacency and overlapping.

5. A method as claimed in claim 4 comprising displacing said at least two two-dimensional slices to represent a slice block.

6. A method as claimed in claim 4 comprising filtering said images in said image domain to produce images having at least one of reduced residual artifacts and improved SNR.

7. A method as claimed in claim 1 comprising displacing said at least two two-dimensional slices by displacing a table on which said subject is located, to cause said at least two two-dimensional slices to have a relationship relative to one another selected from the group consisting of adjacency and overlapping.

8. A method as claimed in claim 7 comprising displacing said at least two two-dimensional slices to represent a slice block.

9. A method as claimed in claim 7 comprising filtering said images in said image domain to produce images having at least one of reduced residual artifacts and improved SNR.

10. A method as claimed in claim 1 comprising automatically electronically calculating said coil sensitivities b a weighted averaging of the respective partial data sets.

11. A method as claimed in claim 1 comprising automatically electronically calculating said coil sensitivities by filtering the respective partial data sets.

12. A method as claimed in claim 1 comprising analyzing said whole images to obtain information selected from the group consisting of patient movement and apparatus-dependent imperfections in the data acquisition.

13. A method as claimed in claim 12 comprising correcting said whole images based on said information.

14. A method as claimed in claim 1 comprising acquiring said magnetic resonance signals in an echo train of a turbo spin-echo pulse sequence.

15. A magnetic resonance tomography apparatus comprising:
    a magnetic resonance scanner having an RF transmitter that excites nuclear spins in an examination subject by irradiating the examination subject with radio-frequency energy from multiple coils among a plurality of component coils of the RF transmitter, each of said coils having a coil geometry that defines a coil sensitivity for that coil;
    said magnetic resonance scanner having an RF receiver that, with said multiple coils, for each of at least two two-dimensional slices of the examination subject, receives magnetic resonance signals resulting from said irradiation with said RF energy, and having a memory in which entering the received magnetic resonance signals as entered as data in k-space, the data in k-space for each of said slices forming a partial data set with a sum of the respective partial data sets of said at least two two-dimensional slices forming a complete data set in k-space, said at least two two-dimensional slices being displaced in a direction of a slice-selection gradient defining a direction normal to said at least two two-dimensional slices; and an image computer that automatically electronically calculates individual coil sensitivities of the respective multiple component coils exclusively from said complete data set, completes at least one partial data set of each of said at least two two-dimensional slices using a PPA reconstruction technique and the calculated individual coil sensitivities, thereby obtaining a plurality of completed slices in k-space, and mathematically transforms the plurality of completed slices in k-space into respective whole images in the image domain.

16. A storage medium encoded with computer-readable data, loadable into a computer arrangement of a magnetic resonance tomography apparatus, comprising a plurality of RF component coils, each of said coils having a coil geometry that defines a coil sensitivity for that coil, to program said computer arrangement to:

operate multiple coils among said component coils excite nuclear spins in an examination subject by irradiating the examination subject with radio-frequency energy from said multiple coils;

with said multiple coils, for each of at least two two-dimensional slices of the examination subject, acquire magnetic resonance signals resulting from said irradiation with said RE energy and entering the received magnetic resonance signals as data in k-space, the data in k-space for each of said slices forming a partial data set with a sum of the respective partial data sets of said at least two two-dimensional slices forming a complete data set in k-space, said at least two two-dimensional slices being displaced in a direction of a slice-selection gradient defining a direction normal to said at least two two-dimensional slices;

automatically electronically calculate individual coil sensitivities of the respective component coils exclusively from said complete data set;

complete at least one partial data set of each of said at least two two-dimensional slices using a PPA reconstruction technique and the calculated individual coil sensitivities, thereby obtaining a plurality of completed slices in k-space; and mathematically transform the plurality of completed slices in k-space into respective whole images in the image domain.

* * * * *